United States Patent
Pan et al.

(10) Patent No.: US 11,817,454 B2
(45) Date of Patent: Nov. 14, 2023

(54) POLYSILICON RESISTOR USING REDUCED GRAIN SIZE POLYSILICON

(71) Applicants: Yanbiao Pan, Plano, TX (US); Robert Martin Higgins, Plano, TX (US); Bhaskar Srinivasan, Allen, TX (US); Pushpa Mahalingam, Richardson, TX (US)

(72) Inventors: Yanbiao Pan, Plano, TX (US); Robert Martin Higgins, Plano, TX (US); Bhaskar Srinivasan, Allen, TX (US); Pushpa Mahalingam, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/463,252

(22) Filed: Aug. 31, 2021

(65) Prior Publication Data

US 2022/0238516 A1    Jul. 28, 2022

Related U.S. Application Data

(60) Provisional application No. 63/141,144, filed on Jan. 25, 2021.

(51) Int. Cl.
*H01L 27/08* (2006.01)
*H01L 21/02* (2006.01)
*H01L 49/02* (2006.01)

(52) U.S. Cl.
CPC .... *H01L 27/0802* (2013.01); *H01L 21/02595* (2013.01); *H01L 28/20* (2013.01)

(58) Field of Classification Search
CPC ........... H01L 27/0802; H01L 21/02595; H01L 28/20; H01L 28/60; H01L 28/82; H01L 28/86; H01L 27/0288; H01L 27/0629; H01L 29/7304
See application file for complete search history.

(56) References Cited

U.S. PATENT DOCUMENTS

| | | | | |
|---|---|---|---|---|
| 5,736,421 A | * | 4/1998 | Shimomura | H01L 27/1052 257/E21.59 |
| 5,751,050 A | * | 5/1998 | Ishikawa | H01L 27/0629 257/536 |
| 6,191,018 B1 | * | 2/2001 | Yue | H01L 28/20 438/651 |

(Continued)

OTHER PUBLICATIONS

Kiely, "Understanding and Eliminating 1/f Noise," Analog Dialogue 51-05, May 2017 https://www.analog.com/en/analog-dialogue/articles/understanding-and-eliminating-1-f-noise.html Analog Devices, Inc., One Analog Way, Wilmington, MA 01887.

*Primary Examiner* — Eduardo A Rodela
(74) *Attorney, Agent, or Firm* — Andrew R. Ralston; Frank D. Cimino

(57) ABSTRACT

Described examples include a resistor having a substrate having a non-conductive surface and a patterned polysilicon layer on the non-conductive surface, the patterned polysilicon layer including polycrystalline silicon wherein at least 90% of the grains in the polycrystalline silicon are 30 nm or smaller. The resistor also has a first terminal in conductive contact with the patterned polysilicon layer and a second terminal in conductive contact with the polysilicon layer and spaced from the first contact.

20 Claims, 7 Drawing Sheets

(56) References Cited

U.S. PATENT DOCUMENTS

| | | | | |
|---|---|---|---|---|
| 6,406,956 B1 * | 6/2002 | Tsai | ............... | H01L 27/0629 |
| | | | | 438/185 |
| 6,586,282 B1 * | 7/2003 | Takasu | ............... | H01L 27/0207 |
| | | | | 257/E23.179 |
| 6,924,544 B2 * | 8/2005 | Wada | ............... | H01L 27/0629 |
| | | | | 257/E27.047 |
| 7,183,593 B2 * | 2/2007 | Yeo | ............... | H01L 29/8605 |
| | | | | 257/E29.085 |
| 7,611,942 B2 * | 11/2009 | Minami | ............... | H01L 27/11573 |
| | | | | 438/210 |
| 7,648,884 B2 * | 1/2010 | Min | ............... | H01L 27/0629 |
| | | | | 438/659 |
| 8,304,839 B2 * | 11/2012 | Thei | ............... | H01L 27/0629 |
| | | | | 438/238 |
| 8,796,772 B2 * | 8/2014 | Yeh | ............... | H01L 29/66795 |
| | | | | 257/350 |
| 8,987,107 B2 * | 3/2015 | Hahn | ............... | H01L 29/66659 |
| | | | | 438/381 |
| 9,379,175 B2 * | 6/2016 | Chung | ............... | H01L 29/0653 |
| 9,991,120 B2 | 6/2018 | Montgomery et al. | | |
| 2002/0123202 A1 * | 9/2002 | Amishiro | ............... | H01L 27/0802 |
| | | | | 257/E27.047 |
| 2006/0166457 A1 * | 7/2006 | Liu | ............... | H01L 27/0629 |
| | | | | 257/E21.004 |
| 2012/0181612 A1 * | 7/2012 | Yang | ............... | H01L 27/0629 |
| | | | | 257/E21.294 |

* cited by examiner 100 nm 100 nm

POLYSILICON RESISTOR USING REDUCED GRAIN SIZE POLYSILICON

CROSS-REFERENCE TO RELATED APPLICATIONS

This application claims the benefit under 35 U.S.C. § 119(e) to co-owned U.S. Provisional Patent Application Ser. No. 63/141,144, filed Jan. 25, 2021, entitled "POLYSILICON RESISTOR DRIFT AND 1/F NOISE REDUCTION USING REDUCED GRAIN SIZE POLYSILICON," which is hereby incorporated by reference in its entirety herein.

TECHNICAL FIELD

This application relates generally to integrated circuits, and more particularly, but not exclusively, to examples of polysilicon resistors.

BACKGROUND

Polycrystalline silicon (polysilicon) resistors are an element of integrated circuits. Polysilicon, as opposed to crystalline silicon, does not have one crystalline structure, but rather includes randomly arranged multiple crystals. One way that integrated circuit designers can include resistors into integrated circuits is using polysilicon resistors. Polysilicon is generally used as a conductive interconnection between components in an integrated circuit and as elements of integrated circuit components, such as the gate electrode of field effect transistors. In this use, the polysilicon material is usually doped and may be clad with a conductive material such as tungsten silicide or molybdenum silicide to provide high conductivity.

In contrast, low doping is used in polysilicon resistors to maximize the polysilicon material's resistance. Even with this low resistance, polysilicon resistors are large by the standards of integrated circuit components. They are often configured in shapes such as serpentine or coils to increase the length between the ends of the resistor while minimizing the space occupied by the resistor.

In precision applications, such as analog circuits, polysilicon resistors are very carefully sized and doped to allow for precise operation of the circuit including the resistor. Sizing of the resistor can be controlled in the fabrication process, but variations in properties of the resistors can cause deviations within an integrated circuit, or between integrated circuits made on a same wafer or in a same lot of wafers. In particular, three characteristics are challenging to control: matching, drift, and 1/f noise. Matching is when resistors are manufactured to have a specific resistance (often to match other resistors) but vary from the precise design resistance. Drift is a change in resistance caused by use. This can be caused by heating and the effects of electron flow through the resistor. 1/f noise is a phenomenon where a resistor is affected by background radiation and/or noise generated in the resistor. Below a threshold frequency, this noise tends to increase with the inverse of the frequency of the noise, thus the name 1/f noise.

SUMMARY

In accordance with an example, a resistor includes a substrate having a non-conductive surface and a patterned polysilicon layer on the non-conductive surface, the patterned polysilicon layer including polycrystalline silicon wherein at least 90% of the grains in the polycrystalline silicon are 30 nm or smaller. The resistor also includes a first terminal in conductive contact with the patterned polysilicon layer and a second terminal in conductive contact with the polysilicon layer and spaced from the first contact.

DETAILED DESCRIPTION

Figure 1:
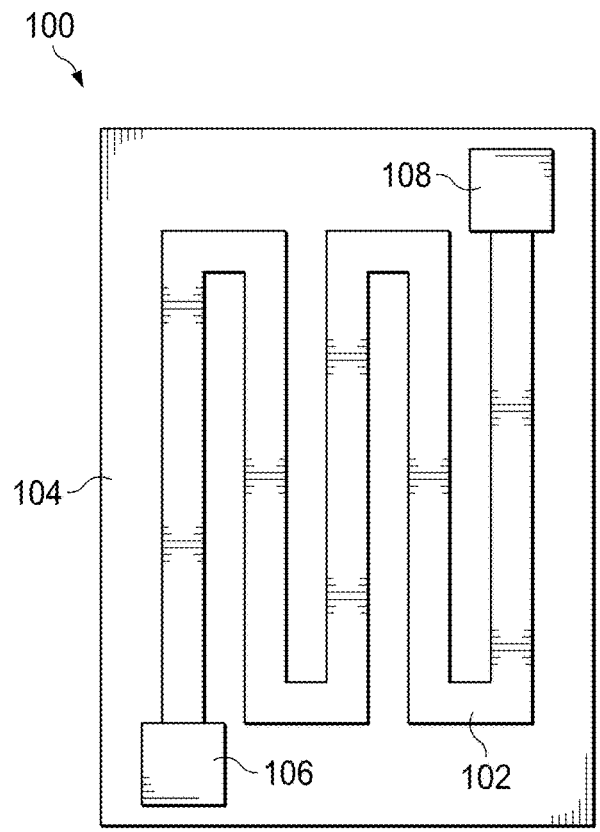
FIG. 1 is a layout view of an example polysilicon resistor.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, as used herein, the terms "on" and "over" may include layers or other elements where intervening or additional elements are between an element and the element that it is "on" or "over."

Without implied limitation, in example arrangements, the problems of drift, matching, and noise in polysilicon resistors are reduced by using polycrystalline silicon material where at least 90% the grain sizes of the material are less than 30 nm in diameter. In an example, a resistor includes a substrate having a non-conductive surface and a patterned polysilicon layer on the non-conductive surface, the patterned polysilicon layer including polycrystalline silicon wherein at least 90% of the grains in the polycrystalline silicon are 30 nm or smaller. The resistor also includes a first contact in conductive contact with the patterned polysilicon layer and a second contact in conductive contact with the polysilicon layer and spaced from the first contact.

FIG. 1 is a layout view of an example polysilicon resistor 100. Substrate 104 is an insulating substrate. In an example, substrate 104 is a semiconductor substrate having an insulating layer on the surface that insulates polysilicon resistor 100 from the semiconductor material. In examples, the semiconductor material of substrate 104 may include silicon-on-insulator material, an epitaxial layer, and other configurations. Patterned polysilicon layer 102 includes first contact pad 106 at one end and second contact pad 108 at the opposite end of patterned polysilicon layer 102. Patterned polysilicon layer 102 is lightly doped to provide high resistance. In this context, "lightly doped" means the polysilicon has a dopant concentration of about $1 \times 10^{15}$ atoms/cm' or less, and/or has a resistivity p of about 300 Ω-cm or greater, "about" meaning±15%. The serpentine configuration is used to provide an extended length between first contact pad 106 and second contact pad 108 while consuming a minimum of area of an integrated circuit or other device in which polysilicon resistor 100 is included.

Figure 2A:
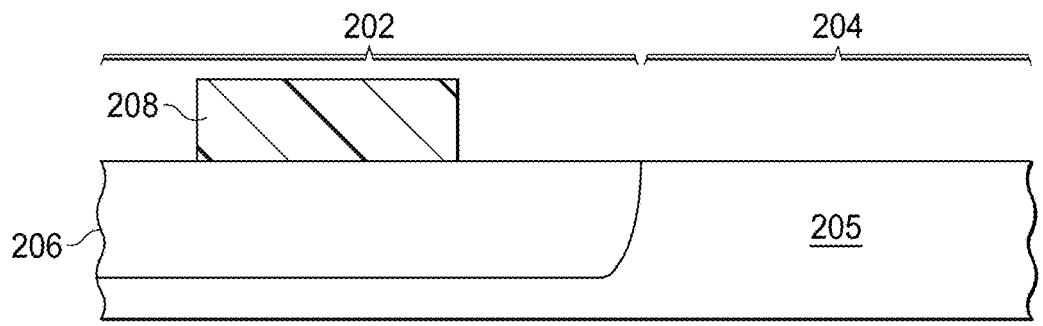
FIGS. 2A-2I (collectively "FIG. 2") are cut-away diagrams of an example process for forming an integrated circuit including an example polysilicon resistor.
Figure 2B:
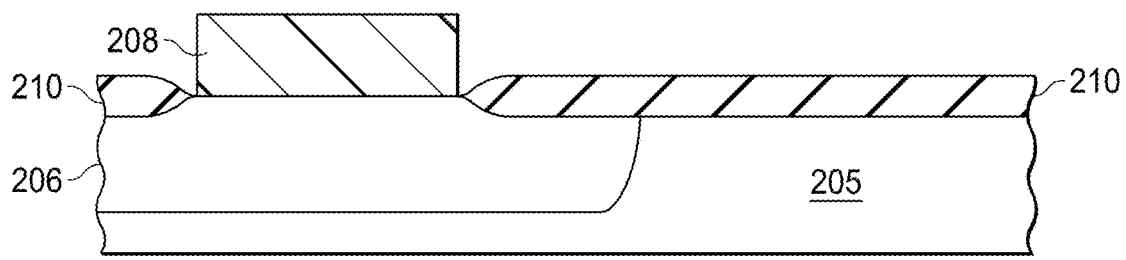

FIGS. 2A-2I (collectively "FIG. 2") are cut-away diagrams of an example process for forming an integrated circuit including an example polysilicon resistor. FIG. 2A shows two areas: the area for a transistor 202 and the area for a resistor 204. These areas indicate where the transistor 202 and part of the resistor 204 are formed. In this example, transistor 202 is a field effect transistor. However, transistor 202 is merely one example of many components that can be fabricated in an integrated circuit with the resistor 204. In addition, the resistor 204 can be a stand-alone resistor without any additional components. Substrate 205 may be a crystalline silicon epitaxial layer that serves as a crystalline silicon substrate in this example. Well 206 is formed in substrate 205 using a patterned implantation of dopant ions (not shown) followed by a thermal drive-in cycle. If transistor 202 is an n-channel transistor, well 206 is a p-type well in this example. First masking layer 208 is a patterned masking layer formed using photolithographic patterning and etching. The structure of FIG. 2A is subject to an oxidizing atmosphere, such as steam, at a high temperature, such as 500° C. to 800° C., to form field oxide 210 as shown in FIG. 2B, which serves as a non-conductive layer. Field oxide 210 has a thickness in a range from 300 Å to 1,000 Å. Masking layer 208 is then removed and the structure is subjected to another oxidation to form gate oxide 211 to a thickness of 50 Å to 200 Å, seen in FIG. 2C.

Figure 2C:
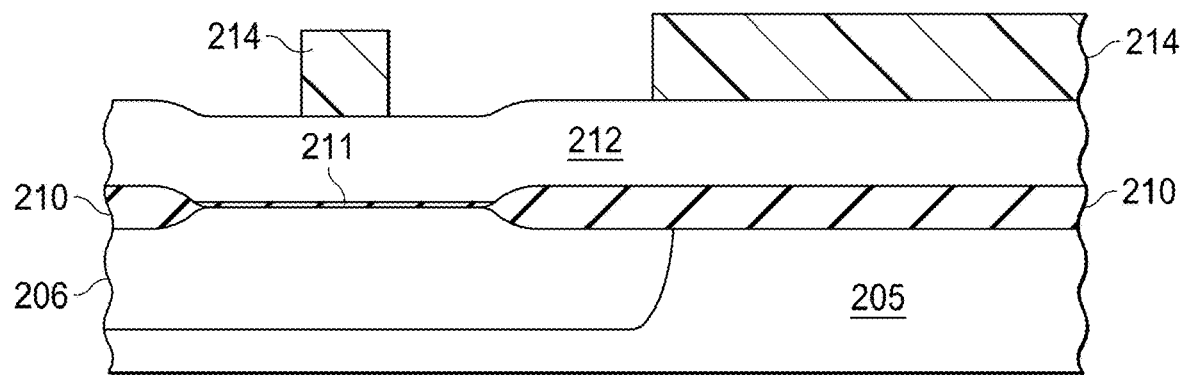
Figure 2D:
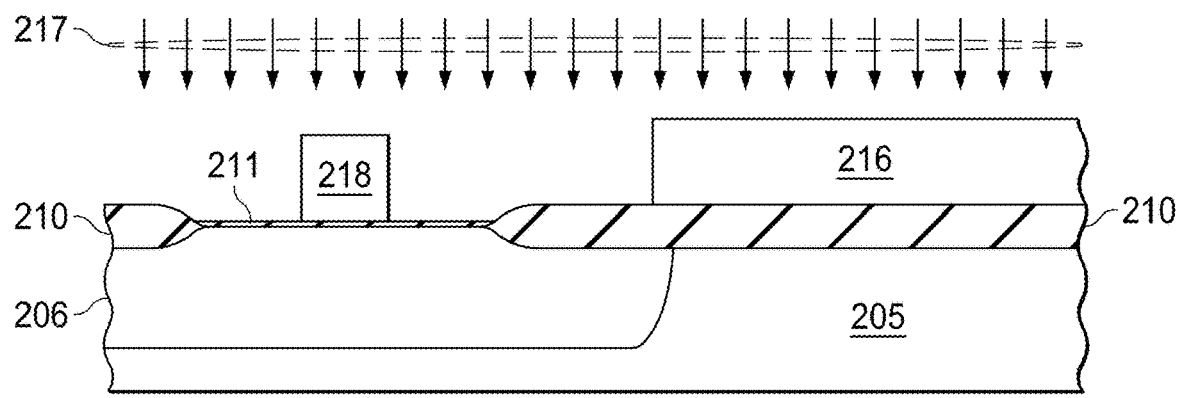

Further in FIG. 2C, a deposition of polycrystalline silicon using silane at a temperature at or less than 610° C., with a flow rate of at least 600 sccm at a pressure at or less than 200 mT (27 Pa) without a carrier gas, such as nitrogen, forms polycrystalline silicon layer 212. Polycrystalline silicon layer 212 has small grains (crystals within the polycrystalline layer) with a size distribution having a peak at about 20 nm (e.g., as determined by converting the grain's area as seen in a transmission electron microscope (TEM) to an equivalent circle, wherein the diameter is the diameter of this circle), and where more than 90% of the grains have a grain size less than 30 nm. This specific deposition process is an example process that produces a layer having small grain sizes. Other processes can be substituted if they produce small grain sizes. Second masking layer 214 is deposited and patterned using photolithography on polycrystalline silicon layer 212. An anisotropic plasma etch with a fluorine bearing plasma, such as carbon tetrafluoride, etches polycrystalline silicon layer 212 using second masking layer 214 as an etch mask. The resulting structure includes gate 218 and polysilicon resistor body 216 as shown in FIG. 2D. In the example of FIG. 2, only a portion of polysilicon resistor body 216 is shown. In examples, the polysilicon resistor body extends to form a length of polysilicon material needed to provide the desired resistance in a coil or serpentine configuration, or any other configuration that provides a resistor structure.

Figure 2E:
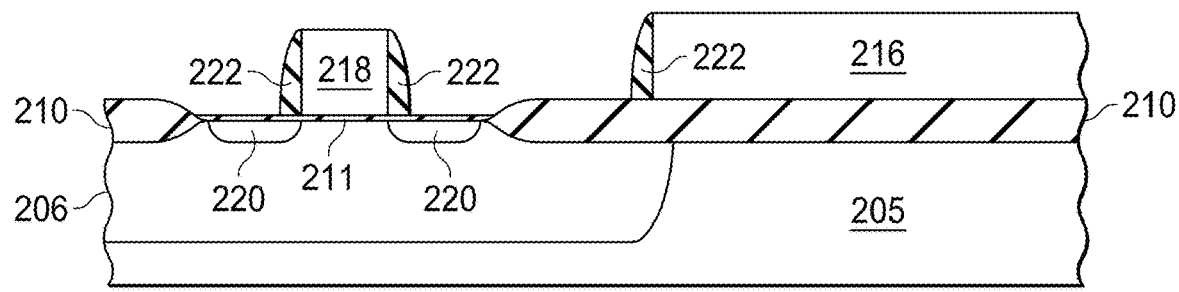
Figure 2F:
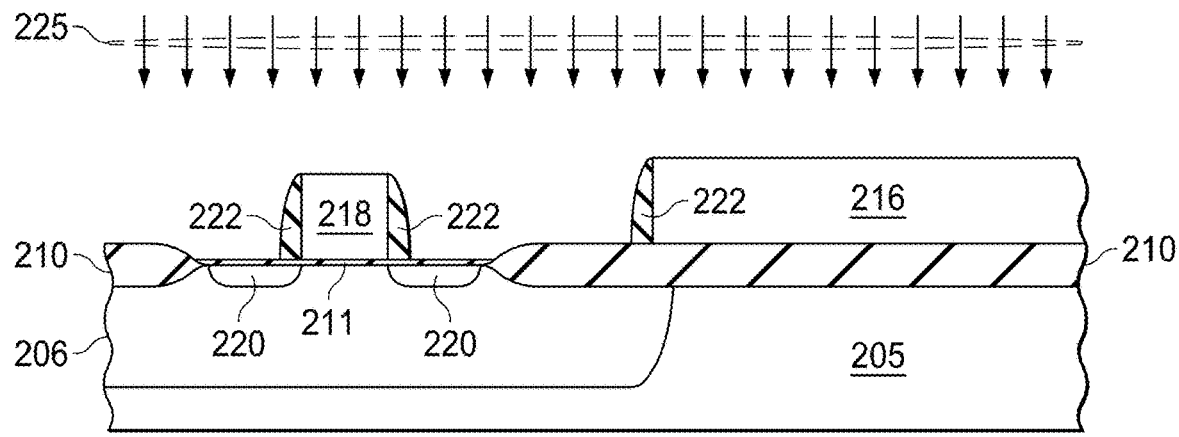
Figure 2G:
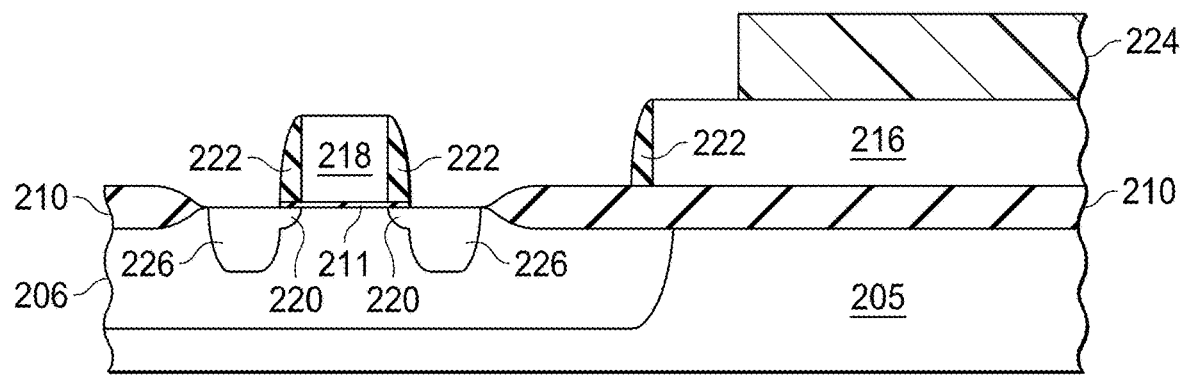
Figure 2H:
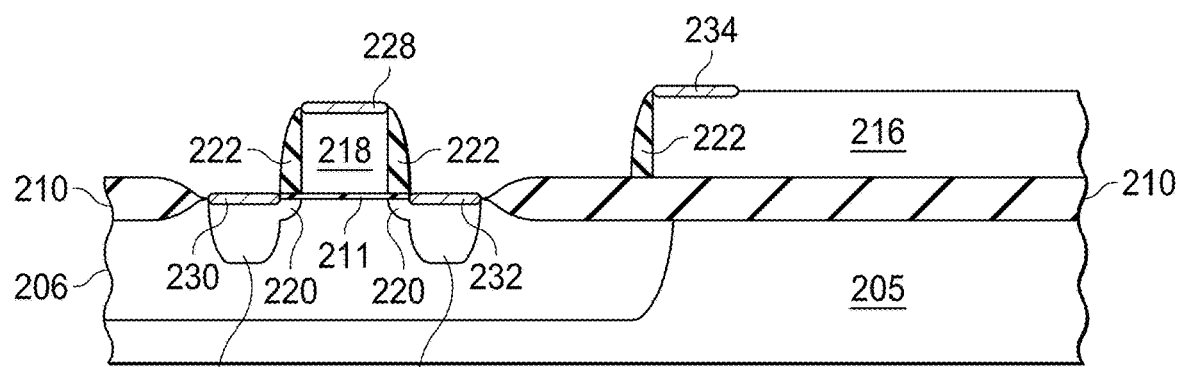

In an example, a first ion implantation 217 (FIG. 2D) of boron ions having a flux density of $5 \times 10^{13}$ ions/cm$^2$ and an energy of 10 keV forms doped source/drain regions 220 after drive in, as shown in FIG. 2E. An insulating layer, such as silicon nitride, is formed over the resistor body 216 and the gate 218 of FIG. 2E and then anisotropically etched to form sidewall layers 222. An ion implantation of boron ions as second ion implantation 225 having a flux density of $3.66 \times 10^{15}$ ions/cm$^2$ and an energy of 4 keV forms source/drain regions 226 after drive-in as shown in FIG. 2G. A short plasma dry etch then removes the exposed portions of gate oxide 211 as shown in FIG. 2G. A silicide blocking layer 224 is formed and patterned as shown in FIG. 2G. The structure of FIG. 2G is then exposed to a metal atom flux, e.g. by sputtering, including atoms that form a conductive layer, such as titanium silicide, molybdenum silicide, and/or cobalt silicide, thereby forming gate silicide 228, first source/drain silicide 230, second source/drain silicide 232 and resistor contact silicide 234 as shown in FIG. 2H. Not shown is that the opposite end of polysilicon resistor body also is silicided in this step. The portion of polysilicon resistor body 216 not covered by resistor contact silicide 234 (FIG. 2G) is lightly doped. This may be achieved by counter doping second implantation 225, including a small amount of dopant in the formation of polycrystalline silicon layer 212 (FIG. 2C), a light implantation of the structure of FIG. 2H, or another procedure such as that shown in Montgomery, U.S. Pat. No. 9,991,120, issued Jun. 5, 2018, which is owned by applicant/assignee, and is hereby incorporated in its entirety herein by reference.

Figure 2I:
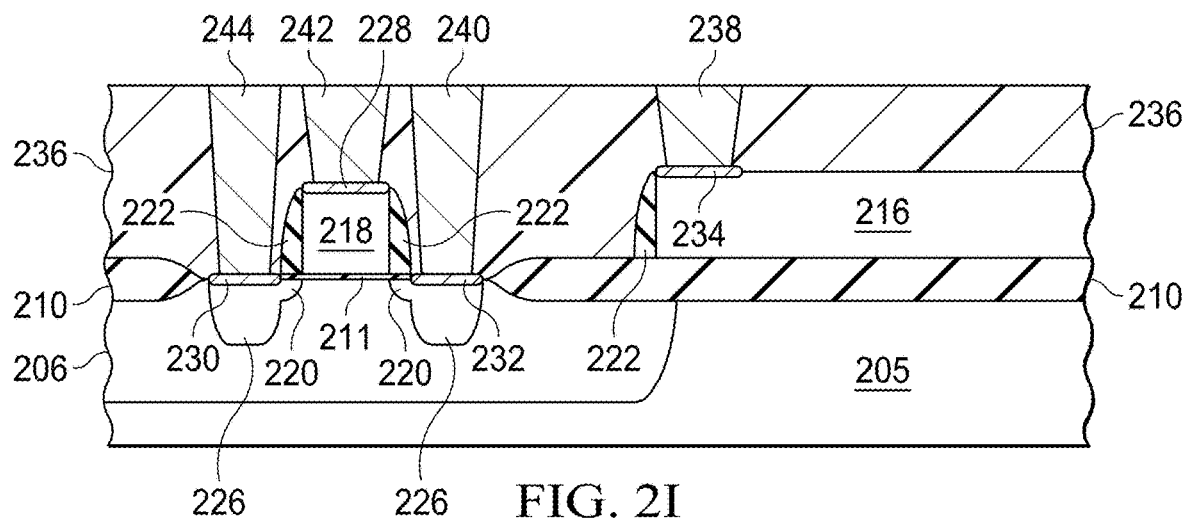

As shown in FIG. 2I, an interlevel dielectric layer 236 is then formed on the structure of FIG. 2H. First via 238, second via 240, third via 242, and fourth via 244 are then formed by etching interlevel dielectric layer 236 using a patterned photolithographic mask and filling the openings formed by the etching with a conductive material such as tungsten and/or titanium. FIG. 2 shows formation of the resistor 204 on an insulating layer, e.g. the field oxide 210, with the via 238 used to couple the resistor to other components from above. In an alternative example, polycrystalline silicon layer 212 (FIG. 2C) may be formed over an opening in field oxide 210 and contacting a diffusion formed in substrate 205 that is part of an active component.

Polycrystalline silicon layer 212 in FIG. 2C is formed using an example process. This example process produces polycrystalline material having smaller grain sizes than a baseline process. Furthermore, the use of polycrystalline silicon with grain sizes having a diameter averaging 20 nm with approximately 90% or more of the grains having a diameter less than 30 nm provides performance advantages for resistors using this polycrystalline silicon, as further explained hereinbelow.

Figure 3A:
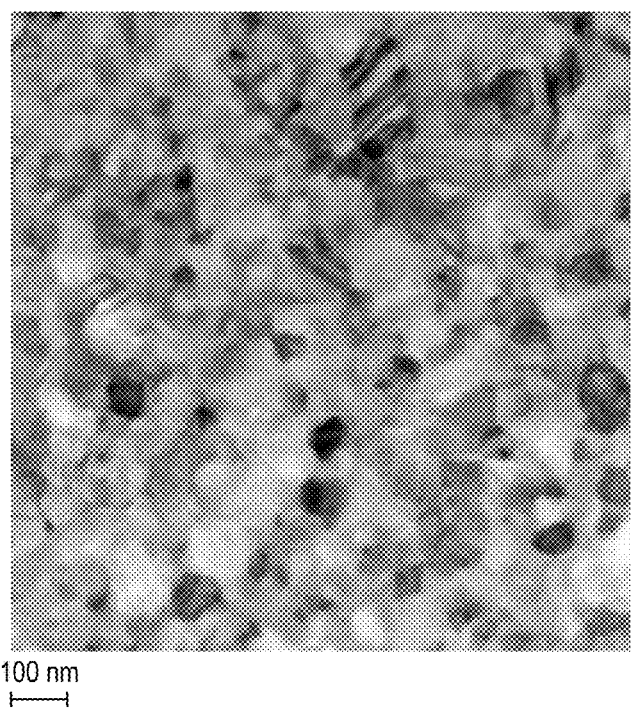
FIGS. 3A and 3B (collectively "FIG. 3") are a scanning electron micrograph and a grain size histogram, respectively, of polycrystalline silicon produced by an example process.
Figure 3B:
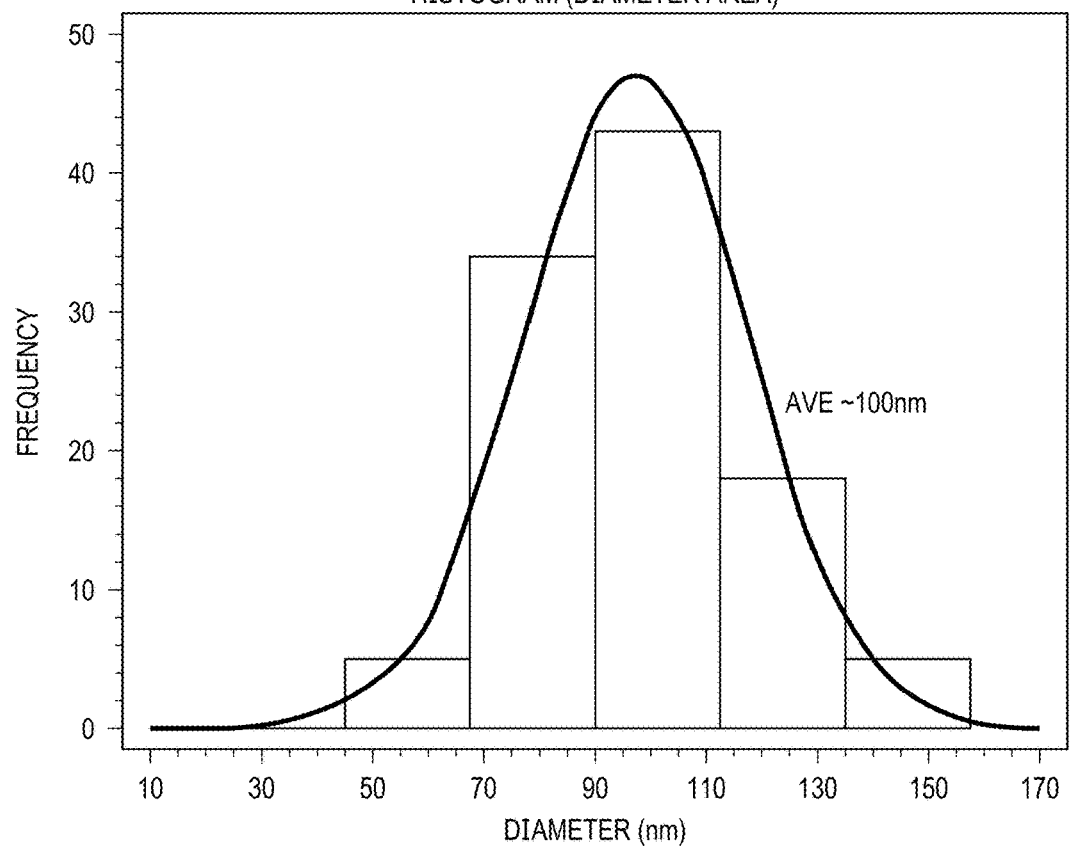

FIGS. 3A and 3B (collectively "FIG. 3") are a scanning electron micrograph and a grain size histogram, respectively, of polycrystalline silicon produced by an example process, e.g. a baseline process. Polycrystalline silicon 300 was produced using a typical commercially available furnace. Substrates (not shown) were placed in the furnace. Silane gas with nitrogen was provided into the furnace chamber at a flow rate of 500 sccm, with a pressure of 300 mT (40 Pa) at 620° C. to produce a polycrystalline silicon layer having a thickness of 1,000 Å to 1,600 Å. The grain sizes produced by this process are shown in histogram 302 in FIG. 3B. As shown in histogram 302, the grain sizes have an approximately Gaussian distribution with a peak and average of about 100 nm in diameter and a 2σ width of about 100 nm.

Figure 4A:
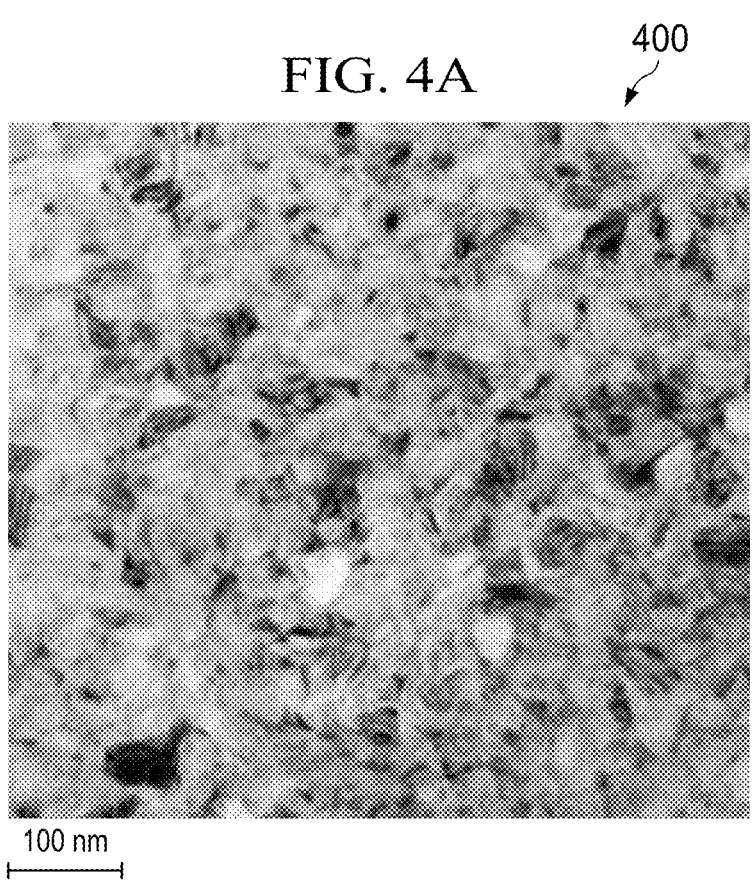
FIGS. 4A and 4B (collectively "FIG. 4") are a scanning electron micrograph and a grain size histogram, respectively, of polycrystalline produced using another example process.
Figure 4B:
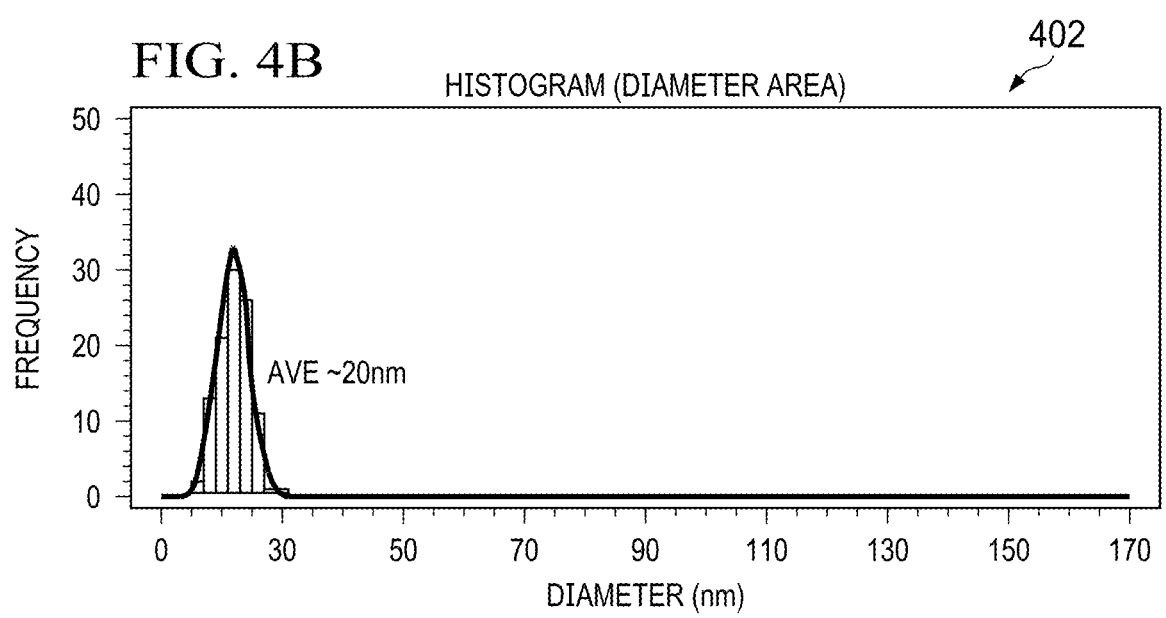

FIGS. 4A and 4B (collectively "FIG. 4") are a scanning electron micrograph and a grain size histogram, respectively, of polycrystalline produced using an example process like that used to produce polycrystalline silicon layer 212 (FIG. 2). Polycrystalline silicon 400 was produce using another commercially available furnace. Substrates (not shown) were placed in the furnace. Silane gas without nitrogen was provided into the furnace chamber at flow rate of approximately 660 sccm, with a pressure of approximately 150 mT (20 Pa) at approximately 605° C. to produce a polycrystalline silicon layer having a thickness of 1,000 Å to 1,600 Å. In this context, "approximately" means±5%. The grain sizes produced by this process are shown in histogram 402 in FIG. 4B. As shown in histogram 402, the grain sizes have an approximately Gaussian distribution with a peak and average of about 20 nm in diameter and a 2σ width of about 15 nm, with greater than 90% of the grain sizes being less than 30 nm.

Figure 5A:
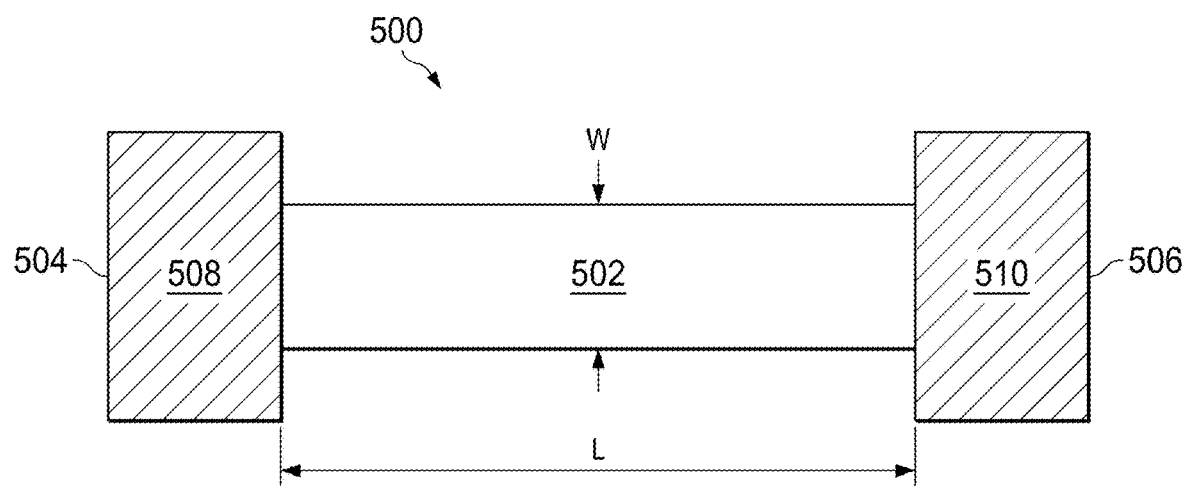
FIGS. 5A and 5B (collectively "FIG. 5") is a plan view and cut-away view, respectively, of an example polysilicon resistor.
Figure 5B:
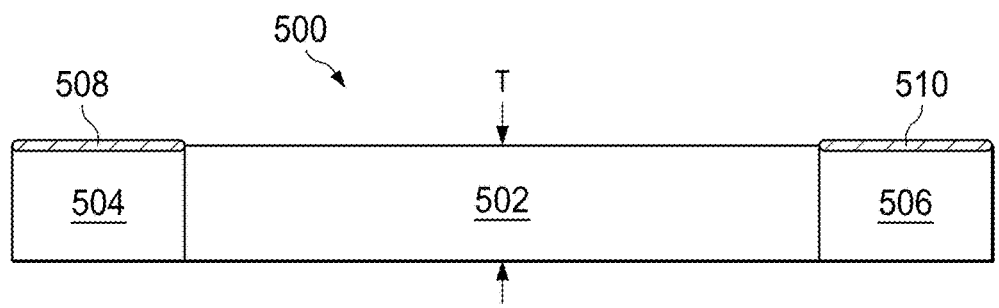

FIGS. 5A and 5B (collectively "FIG. 5") is a plan view and cut-away view, respectively, of an example polysilicon resistor 500. Polysilicon resistor 500 includes body 502, first terminal 504 at one end of body 502 and second terminal 506 at an opposing end of body 502. First terminal 504 includes silicide layer 508, e.g., titanium silicide, and the polycrystalline silicon in first terminal 504 is silicided. Therefore, first terminal 504 is sufficiently conductive that it contributes very little to the resistance of polysilicon resistor 500. Similarly, second terminal 506 includes titanium silicide layer 510 and the polycrystalline silicon in second terminal 506 is also silicided. Therefore, second terminal 506 also contributes very little to the resistance of polysilicon resistor 500. Thus, the resistance of polysilicon resistor 500 is determined by the width W, length L, and thickness T (shown in FIG. 5B) of body 502, along with the sheet resistance ($R_S$) of the material of body 502. The formula for determining the resistance of polysilicon resistor 500 is given by Equation 1:

$$R = R_S \frac{L}{W} \quad (1)$$

Width W, length L and thickness T can be controlled with good precision during manufacturing. In addition, the sheet resistance $R_S$, equal to the resistivity ρ divided by thickness T, can be well controlled. However, for high precision circuits, critical variances must be minimized. Surprisingly, the use of small-grain polycrystalline silicon in resistors provides improvement in at least three important characteristics of polysilicon resistors: drift, matching and 1/f noise.

Figure 6:
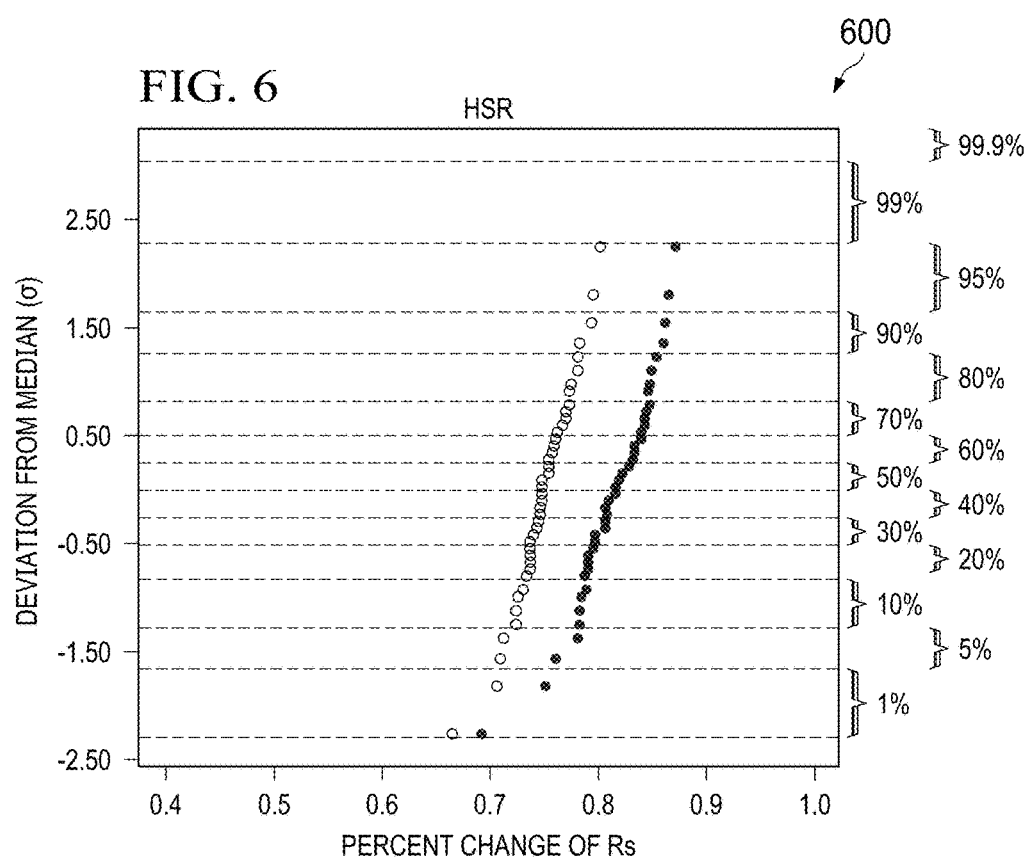
FIG. 6 is a histogram of an example experiment.

Drift is a change in the resistance value of the resistor over time and use of the resistor. FIG. 6 is a normal probability plot 600 of experimental data collected to determine the drift of experimentally fabricated resistors using high sheet resistance (HSR) polycrystalline silicon. HSR polycrystalline silicon has a low effective doping of approximately $5 \times 10^{15}$ atoms/cm$^3$ to $1 \times 10^{16}$ atoms/cm' to provide a high sheet resistance of about 600 Ω/square. With one wafer, including many dies, the polycrystalline silicon layer used to fabricate the resistors was the process described hereinabove with regard to FIG. 3. With another wafer, the polycrystalline silicon used to fabricate the resistors was the process described herein above with regard to FIG. 4. Each wafer was subjected to a temperature of 150° C. for 168 hours to cause drift in the resistor values. The resistance values of the experimental resistors were measured before and after this furnace cycle. The vertical axis corresponds to the percentile deviation of the resistance from the median resistance after the resistors had been subjected to the furnace induced drift. The horizontal axis is the percentage increase in resistance. Data set 602 is the data points for the resistors fabricated using the process of FIG. 4. Data set 604 is the data points for the resistors fabricated using the process of FIG. 3. The percentage values on the right of the chart indicates the percentage of data point less than the indicated line. For example, the 50% line is the median line and half of the data points are less than this value. For the 99.9% line, nearly all of the data points are less than this value. FIG. 6 shows that for each percentile, the increased resistance (drift) is less for data set 602 than data set 604. The median value was an increase of 0.82 for the resistors fabricated using the process of FIG. 3. The median value was an increase of 0.75 for the resistors fabricated using the process of FIG. 4. Therefore, using polycrystalline silicon material produced by the process of FIG. 4 reduced drift in HSR material by 8.5%.

Figure 7:
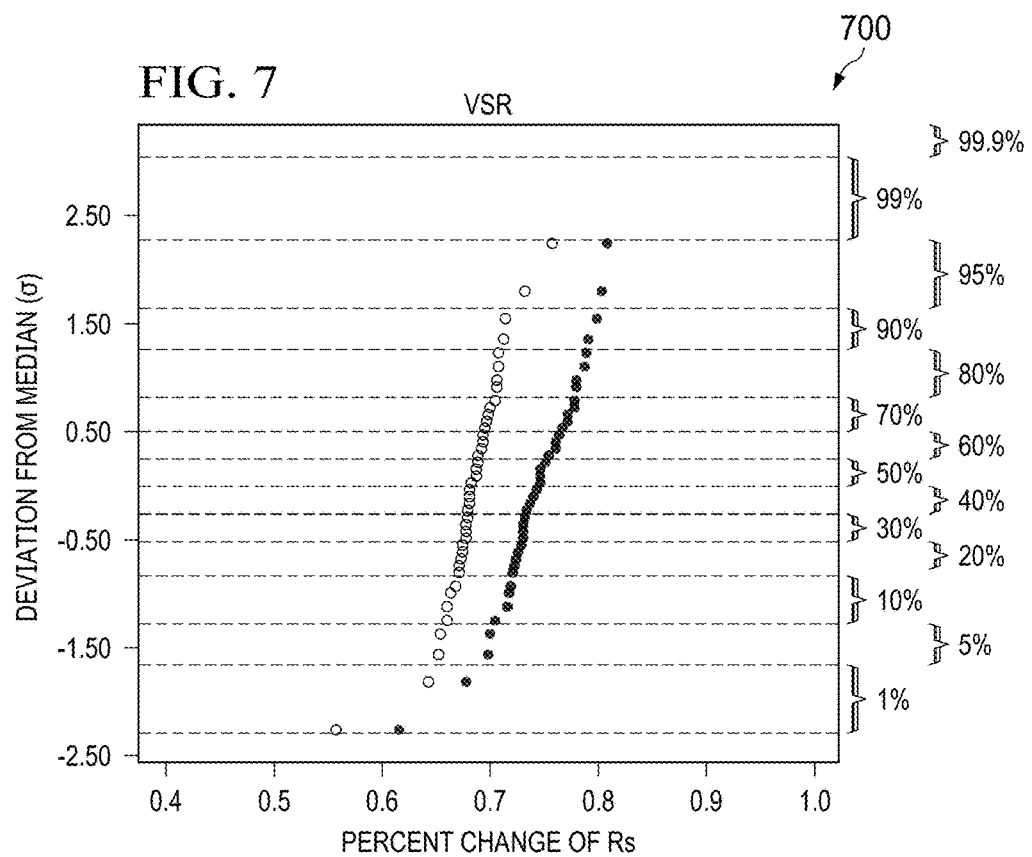
FIG. 7 is a histogram of another example experiment.

FIG. 7 is a normal probability plot of another example experiment like that of FIG. 6 showing the results of the same experiment described above with regard to FIG. 6 using very high sheet resistance (VSR). VSR polycrystalline silicon has a very low effective doping of about $2 \times 10^{15}$ atoms/cm' to provide a very high sheet resistance of about 720 Ω/square. In the plot 700, data set 702 includes the results from the resistors fabricated using the process of FIG. 4. Data set 704 includes the results from the resistors fabricated using the process of FIG. 3. FIG. 7 shows that for each percentile, the increased resistance (drift) is less for data set 702 than for the data set line 704. The median value was an increase of 0.75 for the resistors fabricated using the process of FIG. 3. The median value was an increase of 0.68 for the resistors fabricated using the process of FIG. 4. Therefore, using polycrystalline silicon material produced by the process of FIG. 4 reduced drift in VSR material by 9.3%.

Another important characteristic for precision circuitry is resistor matching. This means that resistors formed to the same size have matching resistance values, or that proportionally sized resistors have proportional resistance. This is important for accurate operation of analog circuitry. In a simple example, if two resistors are made to the same size, they may be used in a voltage divider. That is, the resistors are connected in series with one end connected to a measured voltage and the other end connected to a reference potential. With perfect matching the voltage between the two resistors is half of the difference between the measured voltage and the reference voltage. However, if the resistors do not match, the voltage between the two resistors will be higher or lower than the desired voltage. A voltage divider is only a simple example where matching is important. With precision analog circuits there are many instances where matching performance of resistors limits the accuracy of the circuit including those resistors.

Adjacent resistors in the experimental lots discussed above with regard to drift were measured to determine how well these resistors matched. For HSR polycrystalline material, the average mismatch was 1.68% for polycrystalline silicon material formed using the process described hereinabove with regard to FIG. 3. The average mismatch for the HSR material formed using the process described herein above with regard to FIG. 4 was 1.55%. Therefore, the resistors formed using the process of FIG. 4 provided 7.7% improved matching. For VSR polycrystalline material, the average mismatch was 1.59% form polycrystalline silicon material formed using the process described hereinabove with regard to FIG. 3. The average mismatch for the VSR material formed using the process described herein above with regard to FIG. 4 was 1.47%. Therefore, the VSR resistors formed using the process of FIG. 4 provided 7.8% improved matching. These measurements demonstrate the surprising result that resistors formed using the process described hereinabove with regard to FIG. 4 provide improved matching characteristics.

Another important characteristic is the 1/f noise characteristic. Below a frequency point known as the 1/f corner, background noise begins rising in a near-linear fashion (on a logarithmic scale) from the 1/f corner to near zero frequency (See for example Kiely, "Understanding and Eliminating 1/f Noise," Analog Dialogue 51-05, May 2017, which is incorporated herein by reference in its entirety). In this area, the amplitude of the noise is inversely proportional to the frequency, thus the name 1/f noise. The sources of 1/f noise are a source of considerable debate. However, it is not debatable that semiconductor manufacturers have devoted considerable resources to minimizing 1/f noise. Minimizing noise of any kind is important in precision analog circuitry The experimental lots discussed above with regard to drift were measured to determine the 1/f noise characteristics. For each resistor measured, a bias current of 1.66 mA was applied. The voltage and current through the resistor are measured at a frequency of 100 Hz (chosen for convenience of measurement). Using Fourier analysis of the signal across the resistor, a power density in watts is determined for the noise at that frequency. That total 1/f noise power is divided by the length L and width W of the resistor to provide a normalized measure of watts/$\mu m^2$. For HSR polycrystalline material, the average noise power density was $9.2 \times 10^{-11}$ watts/$\mu m^2$ using the process described hereinabove with regard to FIG. 3. The average noise power density for the HSR material formed using the process described herein above with regard to FIG. 4 was 8.7 $10^{-11}$ watts/$\mu m^2$. Therefore, the resistors formed using the process of FIG. 4 provided 5.4% lower 1/f noise. For VSR polycrystalline material, the average mismatch was $1.16 \times 10^{-10}$ watts/$\mu m^2$ for polycrystalline silicon material formed using the process described hereinabove with regard to FIG. 3. The average mismatch for the VSR material formed using the process described herein above with regard to FIG. 4 was $1.12 \times 10^{-10}$ watts/$\mu m^2$. Therefore, the resistors formed using the process of FIG. 4 provided 4.1% lower 1/f noise. These measurements demonstrate the surprising result that resistors formed using the process described hereinabove with regard to FIG. 4 provide improved 1/f noise characteristics.

Modifications are possible in the described examples, and other examples are possible, within the scope of the claims.

What is claimed is:

1. A resistor comprising:
   a non-conductive surface over a semiconductor substrate;
   a patterned polysilicon layer on the non-conductive surface, the patterned polysilicon layer including polycrystalline silicon wherein 50% of grains in the polycrystalline silicon have a diameter smaller than 20 nm;
   a first terminal connected to the patterned polysilicon layer; and
   a second terminal connected to the patterned polysilicon layer and spaced apart from the first terminal.

2. The resistor of claim 1 wherein the first terminal is at one end of the patterned polysilicon layer and the second terminal is at an opposing end of the patterned polysilicon layer.

3. The resistor of claim 1 wherein the semiconductor substrate includes a crystalline silicon substrate and the non-conductive surface is a top surface of a dielectric layer formed over the crystalline silicon substrate.

4. The resistor of claim 1 wherein the first terminal and the second terminal are silicided.

5. The resistor of claim 1 further including a first conductive layer formed on a surface opposite the non-conductive surface on the first terminal and a second conductive layer formed on the surface opposite the non-conductive surface on the second terminal.

6. The resistor of claim 5 wherein the first conductive layer includes metal silicide, and the second conductive layer includes metal silicide.

7. The resistor of claim 1 further comprising:
   a non-conductive layer on the patterned polysilicon layer;
   a first conductive via extending through the non-conductive layer and in conductive contact with the first terminal; and
   a second conductive via extending through the non-conductive layer and in conductive contact with the second terminal.

8. The resistor of claim 1 wherein the patterned polysilicon layer has a serpentine path.

9. An integrated circuit comprising:
   a semiconductor substrate;
   a non-conductive layer located over the semiconductor substrate;
   at least one active component in or over the semiconductor substrate; and
   a resistor including:
      a patterned polysilicon layer over the non-conductive layer, the patterned polysilicon layer including polycrystalline silicon wherein 50% of grains in the polycrystalline silicon have a diameter smaller than 20 nm;
      a first terminal in the patterned polysilicon layer;
      a second terminal in the patterned polysilicon layer and spaced from the first terminal; and
      a resistive path between the first and second terminals in the patterned polysilicon layer.

10. The integrated circuit of claim 9 wherein the first terminal is at one end of the resistive path and the second terminal is at an opposing end of the resistive path.

11. The integrated circuit of claim 9 wherein the semiconductor substrate includes a crystalline silicon substrate, and the non-conductive layer is formed on a surface of the crystalline silicon substrate.

12. The integrated circuit of claim 9 wherein the first terminal and the second terminal are silicided.

13. The integrated circuit of claim 9 further including a metal-containing conductive layer formed on the first terminal and the second terminal.

14. The integrated circuit of claim 13 wherein the metal-containing conductive layer is silicide.

15. The integrated circuit of claim 9 further comprising:
   an interlevel dielectric layer over the patterned polysilicon layer;
   a first conductive via extending through the interlevel dielectric layer and in conductive contact with the first terminal; and
   a second conductive via extending through the interlevel dielectric layer and in conductive contact with the second terminal.

16. The integrated circuit of claim 9 wherein the patterned polysilicon layer has a serpentine path.

17. An integrated circuit comprising:
   a dielectric layer over a semiconductor substrate;
   a transistor extending into the semiconductor substrate; and
   a polysilicon resistor with a serpentine conductive path over the dielectric layer and including a polycrystalline silicon layer in which 50% of silicon grains have a diameter smaller than 20 nm.

18. The integrated circuit of claim 17 wherein the transistor includes a gate electrode, the gate electrode and the polysilicon resistor formed from a same polycrystalline silicon layer.

19. The integrated circuit of claim 17 wherein the polysilicon resistor includes silicided terminals at opposing ends of the serpentine conductive path.

20. The integrated circuit of claim 17 wherein the polycrystalline silicon layer us lightly doped.

\* \* \* \* \*